United States Patent
Itabashi

(10) Patent No.: US 10,825,852 B2
(45) Date of Patent: Nov. 3, 2020

(54) SOLID STATE IMAGING DEVICE

(71) Applicants: Kabushiki Kaisha Toshiba, Tokyo (JP); Toshiba Electronic Devices & Storage Corporation, Tokyo (JP)

(72) Inventor: Yasushi Itabashi, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/251,431

(22) Filed: Jan. 18, 2019

(65) Prior Publication Data

US 2020/0052023 A1    Feb. 13, 2020

(30) Foreign Application Priority Data

Aug. 13, 2018  (JP) ................. 2018-152303

(51) Int. Cl.
*H01L 27/146*    (2006.01)
*H01L 27/148*    (2006.01)

(52) U.S. Cl.
CPC .. *H01L 27/14625* (2013.01); *H01L 27/14623* (2013.01); *H01L 27/14636* (2013.01); *H01L 27/14812* (2013.01)

(58) Field of Classification Search
CPC ......... H01L 27/14685; H01L 27/14625; H01L 27/14636; H01L 27/14645; H01L 27/14812; H01L 27/14623
See application file for complete search history.

(56) References Cited

U.S. PATENT DOCUMENTS

| | | | |
|---|---|---|---|
| 8,530,994 B2 | 9/2013 | Sasaki | |
| 2008/0170143 A1* | 7/2008 | Yoshida | H01L 27/14621 348/294 |
| 2009/0159944 A1* | 6/2009 | Oh | H01L 27/14609 257/292 |
| 2012/0001292 A1* | 1/2012 | Sasaki | H01L 27/14625 257/443 |
| 2017/0229503 A1 | 8/2017 | Suzuki et al. | |

FOREIGN PATENT DOCUMENTS

| JP | 2012-204686 A | 10/2012 |
|---|---|---|
| JP | 5468478 B2 | 4/2014 |
| JP | 2016-82133 A | 5/2016 |

* cited by examiner

*Primary Examiner* — Mohammed R Alam
(74) *Attorney, Agent, or Firm* — White & Case LLP

(57) ABSTRACT

According to one embodiment, an edge of the second opening is recessed further than an edge of the first opening away from a center of the first opening. The recess has an opening and a concave surface and is disposed in a region inward from the edge of the second opening. The opening has a circular configuration. The concave surface has a curvature.

14 Claims, 5 Drawing Sheets

SOLID STATE IMAGING DEVICE

CROSS-REFERENCE TO RELATED APPLICATION

This application is based upon and claims the benefit of priority from Japanese Patent Application No. 2018-152303, filed on Aug. 13, 2018; the entire contents of which are incorporated herein by reference.

FIELD

Embodiments described herein relate generally to a solid state imaging device.

BACKGROUND

For a solid state imaging device, a phenomenon is known in which a ripple occurs in the spectral characteristics due to interference between light directly entering a photoelectric conversion element (a pixel) and light reflected by a protective film. The ripple causes an unevenness of the image. It has been proposed to reduce the ripple by forming recesses in the protective film.

DETAILED DESCRIPTION

Figure 1:
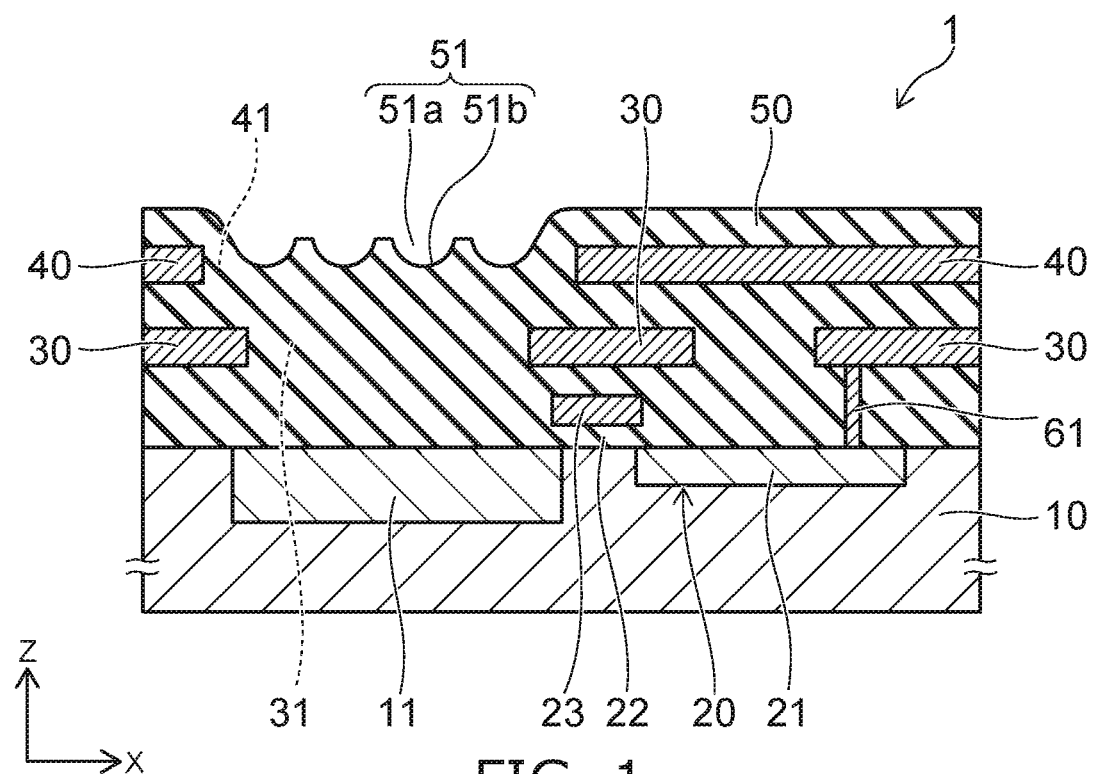
FIG. 1 is a schematic cross-sectional view of a solid state imaging device of an embodiment.

According to an embodiment, a solid state imaging device includes a substrate, a pixel, a first interconnect layer, a second interconnect layer, and an insulating film. The pixel is provided at a surface of the substrate. The first interconnect layer is provided on the substrate. The first interconnect layer has a first opening opposing the pixel. The second interconnect layer is provided on the first interconnect layer. The second interconnect layer has a second opening opposing the first opening. The insulating film covers the pixel, the first interconnect layer, and the second interconnect layer and has a plurality of recesses provided in a region opposing the second opening. An edge of the second opening is recessed further than an edge of the first opening away from a center of the first opening. The recess has an opening and a concave surface and is disposed in a region inward from the edge of the second opening. The opening has a circular configuration. The concave surface has a curvature.

Embodiments will now be described with reference to the drawings. The same components in the drawings are marked with the same reference numerals.

FIG. 1 is a schematic cross-sectional view of a solid state imaging device 1 of a first embodiment.

Figure 2:
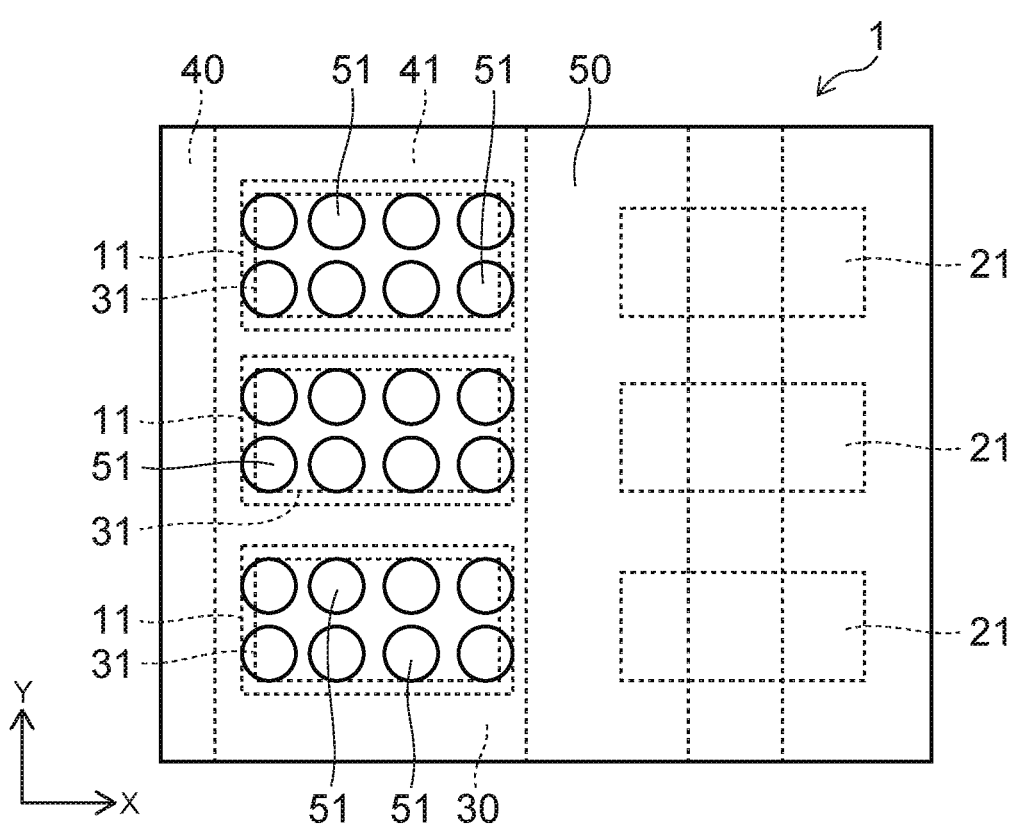
FIG. 2 is a schematic plan view of the solid state imaging device of the embodiment.

FIG. 2 is a schematic plan view of the solid state imaging device 1 of the first embodiment.

Figure 3:
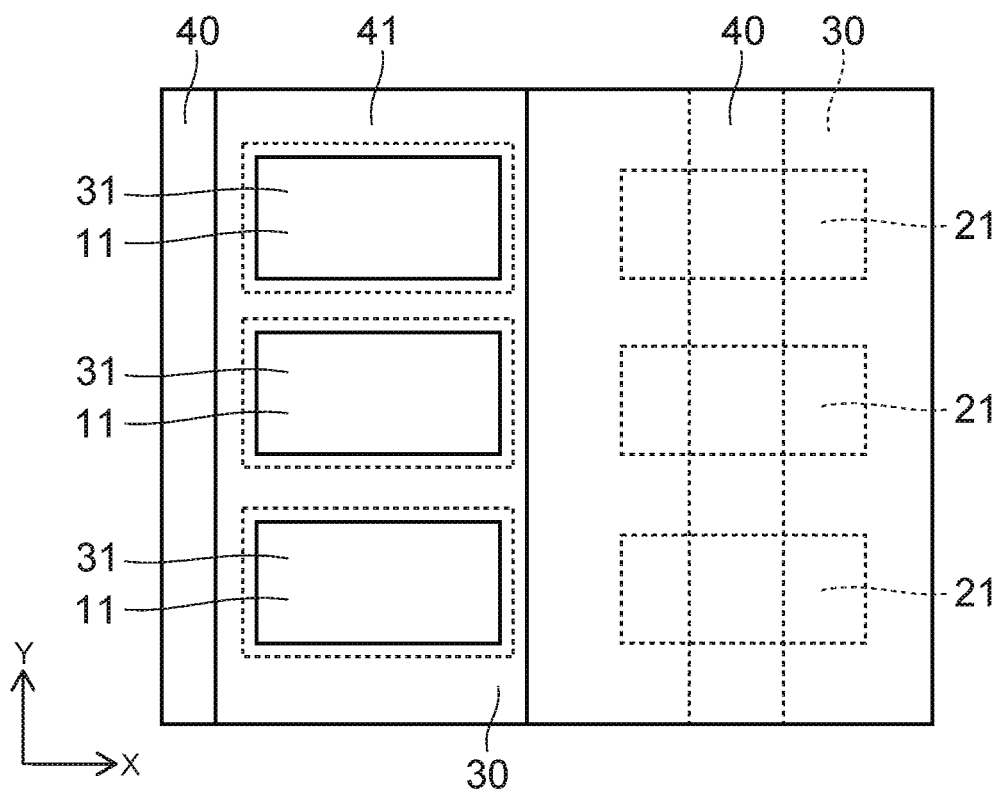
FIG. 3 is a schematic plan view of the solid state imaging device of the embodiment.

FIG. 3 is the schematic plan view of FIG. 2 without an insulating film 50.

The solid state imaging device 1 includes a substrate 10, a pixel 11 provided at the surface of the substrate 10, a charge transfer transistor 20, a first interconnect layer 30, a second interconnect layer 40, and the insulating film 50.

Two mutually-orthogonal directions parallel to the surface of the substrate 10 are taken as an X-direction and a Y-direction. A direction orthogonal to the X-direction and the Y-direction is taken as a Z-direction. FIG. 1 is a cross-sectional view along the X-direction of FIG. 2.

The pixel 11 includes a photoelectric converter. The substrate 10 is, for example, a silicon substrate. The pixel 11 includes, for example, a P-N junction between N-type silicon and P-type silicon. The solid state imaging device 1 is, for example, a linear sensor and includes a pixel column in which multiple pixels 11 are arranged in the Y-direction as shown in FIG. 3.

The charge transfer transistor 20 includes a diffusion layer 21, a gate insulating film 22, and a gate electrode 23. The diffusion layer 21 is, for example, a silicon region doped with an impurity and is provided in a region of the surface of the substrate 10 proximal to the pixel 11.

The gate electrode 23 is provided, with the gate insulating film 22 interposed, on a region between the pixel 11 and the diffusion layer 21.

The first interconnect layer 30 is provided in a layer higher than the gate electrode 23 on the substrate 10. The second interconnect layer 40 is provided in a layer higher than the first interconnect layer 30. The first interconnect layer 30 is connected to the diffusion layer 21 by a via 61. The first interconnect layer 30 is electrically connected to the charge transfer transistor 20 and is included with the charge transfer transistor 20 in a circuit.

The second interconnect layer 40 is not electrically connected to the charge transfer transistor 20 and functions mainly as a light shield.

The insulating film 50 is provided on the substrate 10 to cover the pixel 11, the charge transfer transistor 20, the first interconnect layer 30, and the second interconnect layer 40. The insulating film 50 also covers the periphery of the via 61.

The first interconnect layer 30 and the second interconnect layer 40 are, for example, metal layers including aluminum and are light-shielding and reflective to the light that is to be incident on the pixel 11.

The insulating film 50 is, for example, a silicon oxide film and is transmissive to the light that is to be incident on the pixel 11.

The first interconnect layer 30 has a first opening 31 in a region opposing the pixel 11. As shown in FIG. 3, multiple first openings 31 are arranged in the Y-direction along the arrangement direction of the multiple pixels 11. The first interconnect layer 30 is provided also between the pixels 11 adjacent to each other in the Y-direction.

The width in the X-direction of the first opening 31 is narrower than the width in the X-direction of the pixel 11; and the edge of the first opening 31 is positioned in a region overlapping the pixel 11 above the pixel 11.

The second interconnect layer 40 has a second opening 41 opposing the first opening 31 of the first interconnect layer 30. As shown in FIG. 3, the second opening 41 extends in a slit configuration in the Y-direction along the region where the multiple first openings 31 are arranged.

The edge of the second opening 41 is recessed further than the edge of the first opening 31 away from the center of the first opening 31. The edge of the second opening 41 is recessed along the X-direction further than the edge of the first opening 31.

The insulating film 50 has multiple recesses 51 provided in a region opposing the second opening 41. Each of the recesses 51 has an opening 51a having a circular configuration when viewed in the top view, and a concave surface 51b having a curvature. The configuration of the opening 51a of the recess 51 is not limited to a perfect circle. In the example shown in FIG. 1, a portion of the insulating film 50 between the recesses 51 adjacent to each other in the X-direction is provided in a protruding configuration. Also, a portion of the insulating film 50 between the recesses 51 adjacent to each other in the Y-direction is provided in a protruding configuration.

The multiple recesses 51 are disposed in a region above one pixel 11. The multiple recesses 51 are disposed in a region inward from the edge of the second opening 41. A portion of the recesses 51 overlaps a region outside the first opening 31.

The regions of the surface of the substrate 10 other than the pixels 11 are covered and optically shielded by the first interconnect layer 30 and the second interconnect layer 40.

Figure 8:
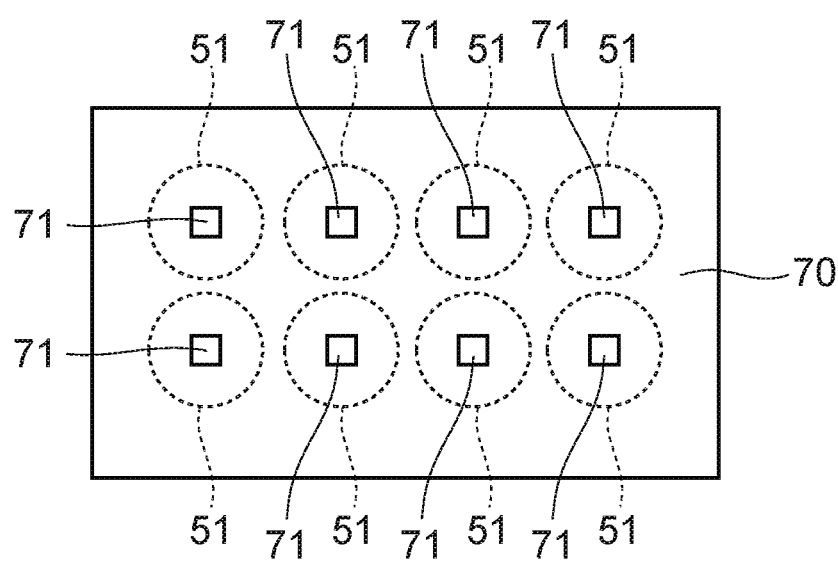
FIG. 8 is a schematic plan view showing a method for forming multiple recesses of the solid state imaging device of the embodiment.

FIG. 8 is a schematic plan view showing a method for forming the multiple recesses 51.

The first interconnect layer 30, the second interconnect layer 40, the insulating film 50, etc., are formed on the substrate 10; subsequently, a resist 70 is formed on the insulating film 50.

Then, multiple openings 71 are formed in regions of the resist 70 positioned above the pixel 11 by exposing and developing the resist 70. Wet etching of the surface of the insulating film 50 is performed using the resist 70 as a mask. As illustrated by the broken lines in FIG. 8, the etching progresses isotropically from the portions of the insulating film 50 exposed in the openings 71 of the resist 70; and the multiple recesses 51 are formed.

The light that is not directly incident on the pixel 11 and is reflected by the surface of the substrate 10 to return upward can be reflected by the curved concave surfaces 51b of the recesses 51. The light that is reflected by the concave surfaces 51b does not easily reach the pixel 11 due to the diffusion due to a concave lens effect. Accordingly, the ripple of the spectral characteristics due to the interference between such reflected light and the light directly incident on the pixel 11 can be suppressed.

Figure 9:
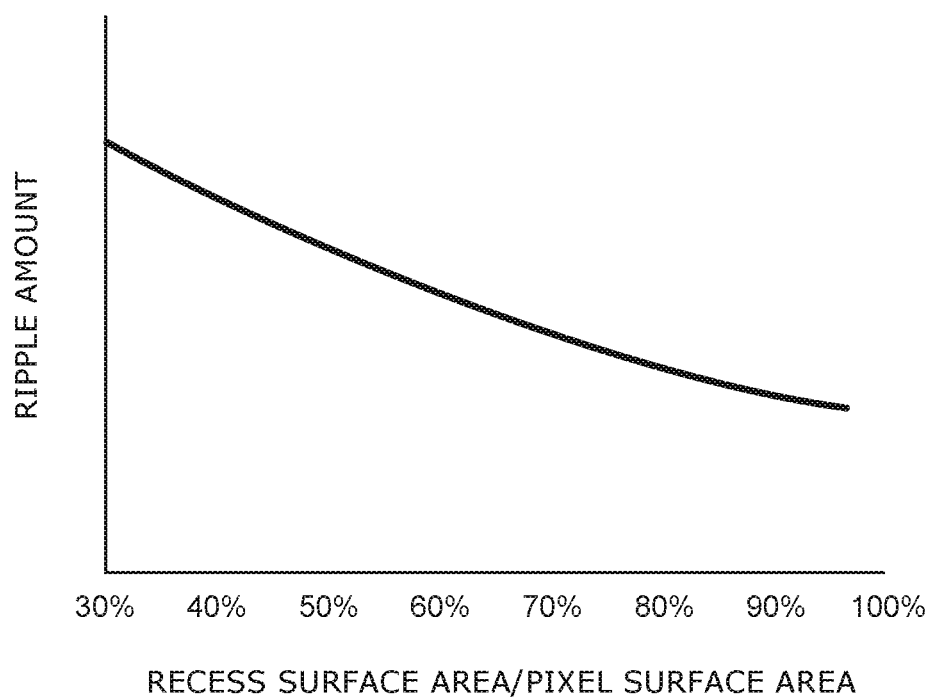
FIG. 9 is a graph showing a relationship between a ripple amount of a spectral characteristics and a surface area of a recesses.

FIG. 9 is a graph showing a relationship between the ripple amount of the spectral characteristics and the surface area of the recesses 51.

The horizontal axis is the ratio of the surface area of the multiple recesses 51 (the multiple recesses 51 disposed above one pixel 11) to the surface area of the one pixel 11. Here, the surface area of the recesses 51 refers not to the surface area of the recesses 51 including the concave surfaces 51b but to the surface area of the region where the multiple openings 51a are disposed when viewed in the top view.

It can be confirmed from the graph of FIG. 9 that the ripple suppression effect increases as the surface area of the recesses 51 increases.

In the case where the surface area of the recesses 51 is increased, there is a risk that overlap between the second interconnect layer 40 and the recesses 51 may occur; and the second interconnect layer 40 that is under the insulating film 50 may be exposed. The exposure of the second interconnect layer 40 may reduce the reliability. On the other hand, the enlargement of the surface area of the recesses 51 is obstructed if the recesses 51 are formed not to overlap the second interconnect layer 40.

In the solid state imaging device, generally, the interconnect layer of the uppermost layer functions as a light shield. According to the embodiment, the light-shielding function is performed not only by the interconnect layer of the uppermost layer (the second interconnect layer 40) but also by the first interconnect layer 30 provided under the second interconnect layer 40. In other words, multiple interconnect layers of different layers cover and optically shield the regions other than the pixel 11.

The region at the vicinity of the outer edge of the pixel 11 is optically shielded by the first interconnect layer 30. Therefore, the width (the width in the X-direction) of the second opening 41 of the second interconnect layer 40 can be wider than the width (the width in the X-direction) of the pixel 11. The region of the recesses 51 can be wider by the amount that the width of the second opening 41 is enlarged. Accordingly, according to the embodiment, the region of the recesses 51 can be widened while reliably covering and protecting the second interconnect layer 40 of the uppermost layer with the insulating film 50; and it is possible to increase the suppression effect of the ripple.

Figure 4:
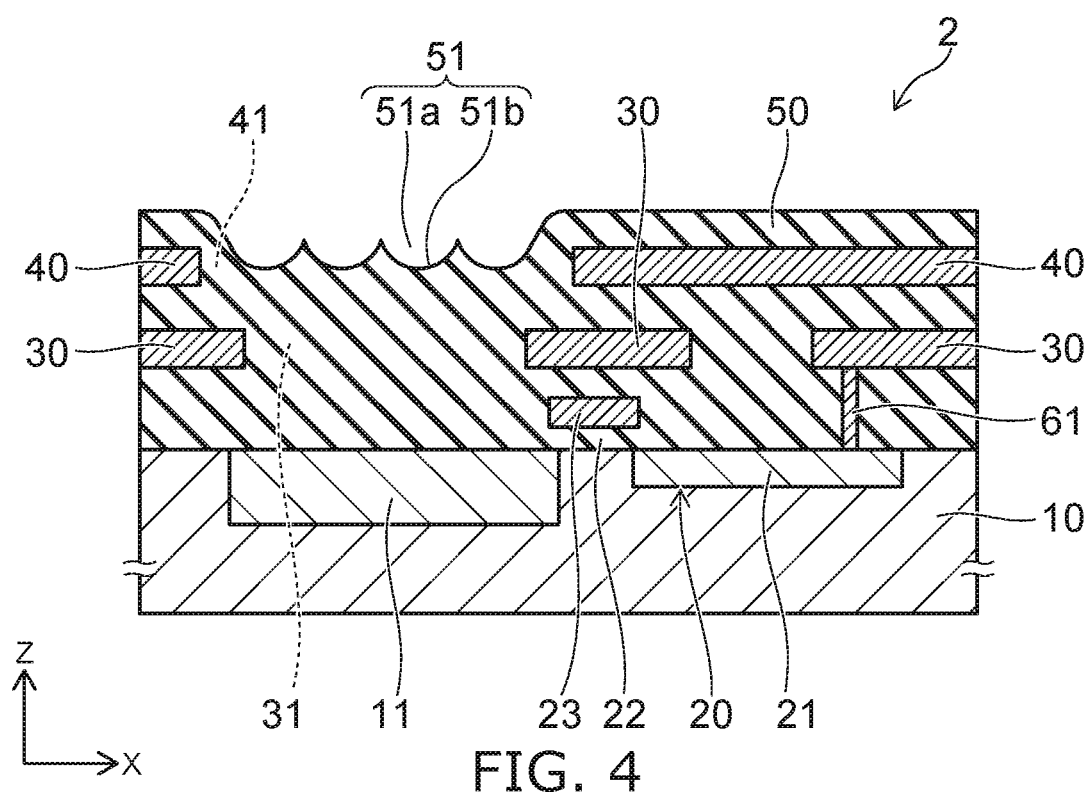
FIG. 4 is a schematic cross-sectional view of a solid state imaging device of an embodiment.

FIG. 4 is a schematic cross-sectional view of a solid state imaging device 2 of a second embodiment.

Figure 5:
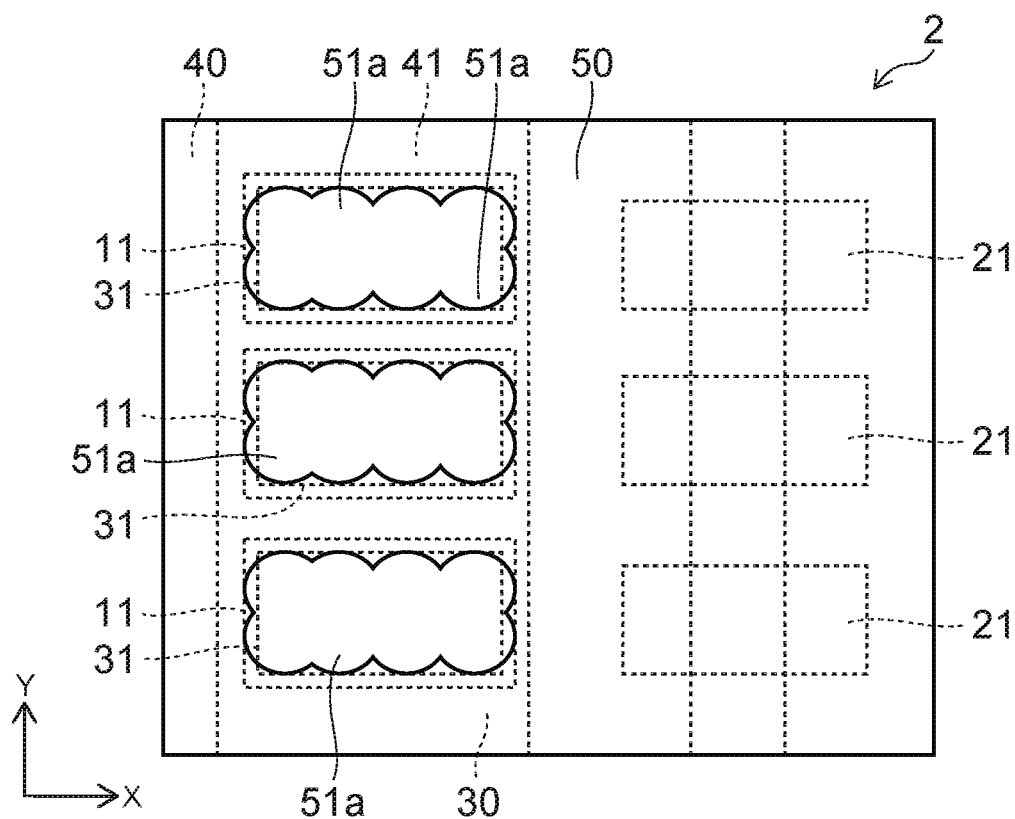
FIG. 5 is a schematic plan view of the solid state imaging device of the embodiment.

FIG. 5 is a schematic plan view of the solid state imaging device 2 of the second embodiment.

FIG. 4 is a cross-sectional view along the X-direction of FIG. 5.

The circular opening 51a of the recess 51 includes a region overlapping the opening 51a of another recess 51 when viewed in the top view. A portion of the opening 51a of the recess 51 overlaps a portion of the opening 51a of another recess 51 adjacent in the X-direction. A portion of the opening 51a of the recess 51 overlaps a portion of the opening 51a of another recess 51 adjacent in the Y-direction.

In the case where the insulating film 50 has a flat surface in the region above the pixel 11, the light that is reflected by the surface of the substrate 10 is reflected by the flat surface and easily reaches the pixel 11; and the interference between the directly-incident light and the reflected light occurs easily. According to the second embodiment, by setting the openings 51a of the multiple recesses 51 to overlap each other, the surface area of the flat portion of the insulating film 50 in the region above the pixel 11 can be reduced; and the ripple suppression effect can be increased further.

Figure 6:
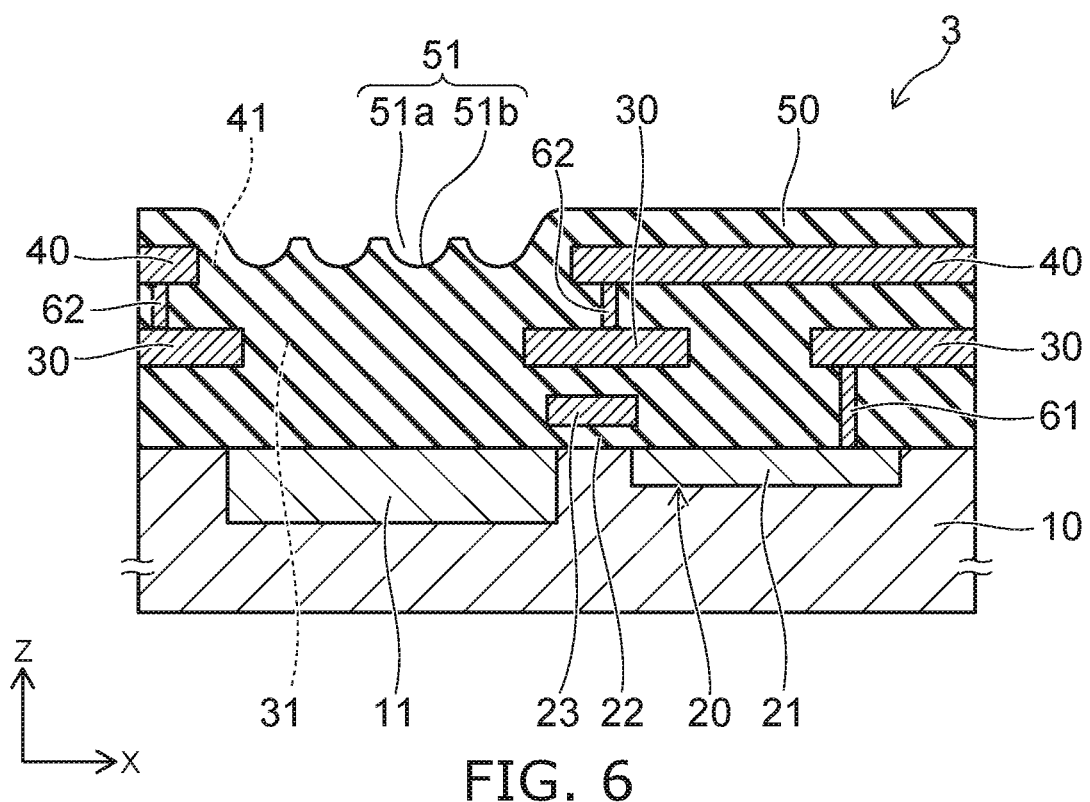
FIG. 6 is a schematic cross-sectional view of a solid state imaging device of an embodiment.

FIG. 6 is a schematic cross-sectional view of a solid state imaging device 3 of a third embodiment.

Figure 7:
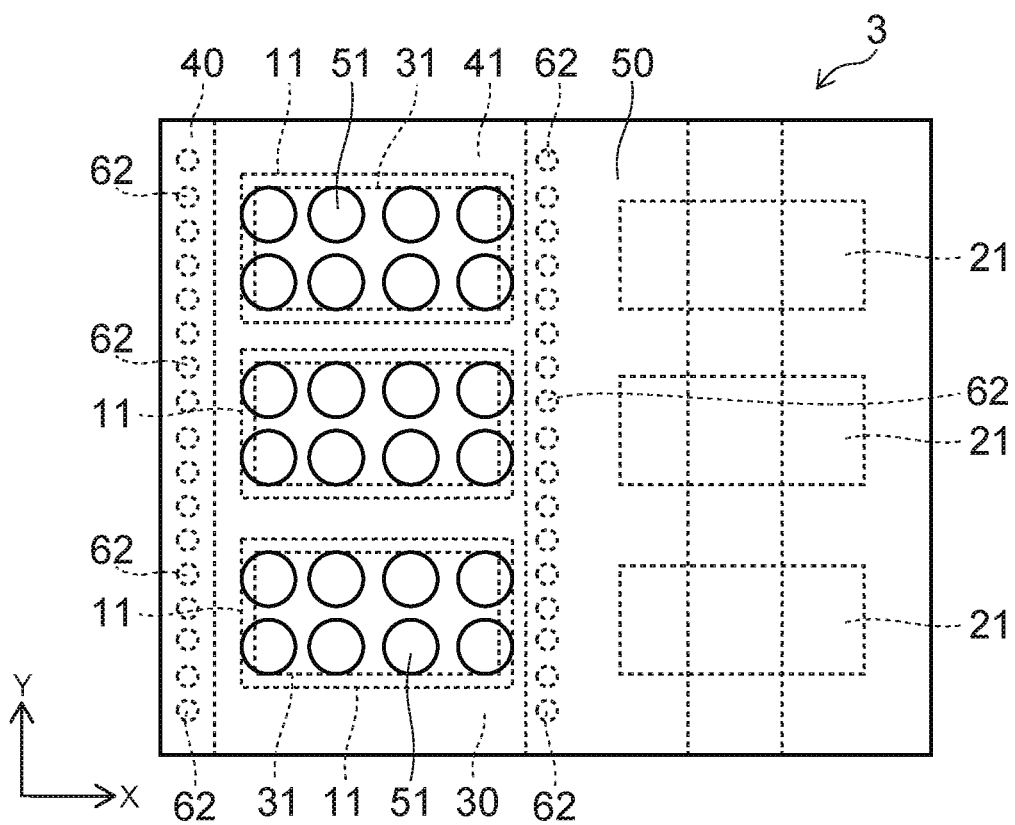
FIG. 7 is a schematic plan view of the solid state imaging device of the embodiment.

FIG. 7 is a schematic plan view of the solid state imaging device 3 of the third embodiment.

FIG. 6 is a cross-sectional view along the X-direction of FIG. 7.

Multiple vias 62 are provided between the second interconnect layer 40 and the first interconnect layer 30 at the vicinity of the edge of the second opening 41. The vias 62 connect the second interconnect layer 40 and the first interconnect layer 30. The vias 62 are metal members that are reflective to the light that is to be incident on the pixel 11.

As shown in FIG. 7, the multiple vias 62 are arranged in the Y-direction at the vicinity of the edge in the X-direction of the pixel 11. The multiple vias 62 are arranged to sandwich, in the X-direction, the region above the pixel 11.

The light that is reflected and diffused by the concave surfaces 51b of the recesses 51 can be reflected by the vias 62 and caused to travel toward the pixel 11. This reduces the reflected light not incident on the pixel 11, and increases the sensitivity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A solid state imaging device, comprising:
   a substrate;
   a pixel provided at a surface of the substrate;
   a first interconnect layer provided on the substrate, the first interconnect layer having a first opening opposing the pixel;
   a second interconnect layer provided on the first interconnect layer, the second interconnect layer having a second opening opposing the first opening; and
   an insulating film covering the pixel, the first interconnect layer, and the second interconnect layer and having a plurality of recesses provided in a region opposing the second opening,
   an edge of the second opening being farther than an edge of the first opening away from a center of the first opening,
   each of the plurality of recesses having an opening and a concave surface and being disposed in a region inward from the edge of the second opening, the opening having a circular configuration, the concave surface having a curvature in a cross-sectional view of the insulating film.

2. The device according to claim 1, wherein adjacent openings of the plurality of recesses overlap in a top view.

3. The device according to claim 1, further comprising a plurality of vias provided between the second interconnect layer and the first interconnect layer at a vicinity of the edge of the second opening.

4. The device according to claim 3, wherein the plurality of vias are metal members.

5. The device according to claim 3, wherein
   a plurality of the pixels is arranged in a first direction, and
   the plurality of vias is arranged in the first direction.

6. The device according to claim 5, wherein the plurality of vias is arranged to sandwich, in a second direction crossing the first direction, a region above the plurality of pixels.

7. The device according to claim 1, wherein
   a plurality of the pixels is arranged in a first direction, and
   the edge of the second opening is farther than the edge of the first opening along a second direction crossing the first direction.

8. The device according to claim 7, wherein the first interconnect layer is provided also between the plurality of pixels adjacent to each other in the first direction.

9. The device according to claim 8, wherein a plurality of the first openings is arranged in the first direction.

10. The device according to claim 9, wherein the second opening extends in a slit configuration in the first direction.

11. The device according to claim 1, wherein the edge of the first opening is positioned in a region overlapping the pixel.

12. The device according to claim 1, wherein the device is a linear sensor including a pixel column including a plurality of the pixels arranged in a first direction.

13. The device according to claim 1, further comprising a diffusion layer provided in a region of the surface of the substrate proximal to the pixel, the first interconnect layer being connected to the diffusion layer.

14. The device according to claim 1, wherein the first interconnect layer and the second interconnect layer include aluminum.

* * * * *